United States Patent [19]
Lyall, Jr. et al.

[11] Patent Number: 6,026,285
[45] Date of Patent: *Feb. 15, 2000

[54] INTERMODULATION DISTORTION REDUCTION CIRCUIT UTILIZING VARIABLE ATTENUATION

[75] Inventors: Robert L. Lyall, Jr., Loganville; Richard I. Bain, Suwanee, both of Ga.

[73] Assignee: Oki Telecom, Inc., Suwanee, Ga.

[*] Notice: This patent is subject to a terminal disclaimer.

[21] Appl. No.: 08/825,270

[22] Filed: Mar. 27, 1997

Related U.S. Application Data

[63] Continuation of application No. 08/571,511, Dec. 13, 1995
[60] Provisional application No. 60/003,625, Sep. 12, 1995.

[51] Int. Cl.$^7$ .................................................. H04B 1/06
[52] U.S. Cl. ................................. 455/249.1; 455/234.1; 455/245.1; 455/550; 330/149; 375/345
[58] Field of Search ........................ 455/89, 232.1, 455/234.1, 234.2, 239.1, 237.1, 245.1, 248.1, 249.1, 240.1, 252.1, 254, 63, 295, 550, 33.1, 74, 422; 375/345, 205; 330/284, 144, 145, 149; 370/18, 320, 335

[56] References Cited

U.S. PATENT DOCUMENTS

| | | | |
|---|---|---|---|
| 723,075 | 6/1991 | Ishii | 455/254 |
| 3,624,561 | 11/1971 | Tongue | 333/6 |
| 4,531,234 | 7/1985 | Bell | 455/249.1 |
| 4,553,105 | 11/1985 | Sasaki | 330/145 |
| 5,187,809 | 2/1993 | Rich et al. | 455/33.1 |
| 5,369,792 | 11/1994 | Matsumoto et al. | 455/245.1 |
| 5,438,863 | 8/1995 | Durtler et al. | 455/74 |
| 5,465,408 | 11/1995 | Sugayama et al. | 455/249.1 |
| 5,469,115 | 11/1995 | Peterzell et al. | 330/129 |
| 5,530,926 | 6/1996 | Rozanski | 455/277.2 |
| 5,697,081 | 12/1997 | Lyall et al. | 455/249.1 |

FOREIGN PATENT DOCUMENTS

| | | |
|---|---|---|
| 60-103743 | 6/1985 | Japan . |
| 255428 | 2/1990 | Japan . |
| 3297227 | 12/1991 | Japan . |

*Primary Examiner*—Lee Nguyen
*Attorney, Agent, or Firm*—Thomas, Kayden, Horstemeyer & Risley LLP

[57] ABSTRACT

A variable attenuator circuit provides variable attenuation responsive to received signal strength in a receiver to reduce intermodulation (IM) distortion. In a dual-mode frequency modulation/code division multiple access (FM/CDMA) cellular telephone implementation, the variable attenuator circuit decreases IM distortion by variably attenuating received radio frequency (RF) signals before an initial RF amplification stage to reduce the level of undesirable frequency mixing products. The variable attenuator circuit is turned on (activated) and off (deactivated) at a single, relatively low, input power level. An attenuator enable signal is also supplied from a logic unit of the mobile station to enable operation of the variable attenuator circuit throughout operation in a digital mode. Thus, while enabled, as soon as the input signal power level rises above a defined activation threshold amount, the variable attenuator circuit is activated and begins attenuating the input signal responsive to input signal power levels based upon a received signal strength indication output from a separate automatic gain control circuit. After the attenuation begins gradually, thus avoiding excessive chattering without the need for hysteresis, the attenuation rises non-linearly and continuously to quickly mitigate IM distortion problems.

23 Claims, 7 Drawing Sheets

INTERMODULATION DISTORTION REDUCTION CIRCUIT UTILIZING VARIABLE ATTENUATION

This application is a continuation of application Ser. No. 08/571,511, filed on Dec. 13, 1995 which claims §119 priority from provisional application Ser. No. 60/003,625, filed on Sep. 12, 1995.

BACKGROUND OF THE INVENTION

The present invention relates generally to the field of telecommunications, and more specifically, to the field of intermodulation spurious response attenuation in cellular telephones.

Intermodulation (IM) signals are problematic in radio communication systems, such as cellular communication systems, since they can interfere with communication signal processing under certain circumstances. IM signals are extraneous signals produced when two or more interfering signals combine and are, for example, mixed in a non-linear medium such as the non-linear operating region of a semiconductor device such as an amplifier. One situation where this problem occurs is where a mobile station operating in a digital mode is far from a digitally transmitting base station but very close to an interfering analog transmitting base station. In such a situation, the mobile station receives very strong interfering analog signals relative to the desired received digital signals. These very strong interfering analog signals often result in the production of intermodulation signals that fall into the frequency range of the desired digital signal frequency spectrum, the effects of which are to increase the communication errors at the mobile station, potentially causing calls to be dropped.

While the problems of IM distortion are not isolated to one particular type of radio communication system the wideband spread spectrum cellular communication system is one type of radio communication system which is sensitive to the problems of IM distortion. IM distortion is currently addressed in section 9.4.3 of the standard promulgated by the Telecommunications Industry Association (TIA) and the Electronics Industry Association (EIA), TIA/EIA/IS-98, entitled "Recommended Minimum Performance Standards for Dual-Mode Wideband Spread Spectrum Cellular Mobile Stations". Currently, the standard calls for a mobile station receiver performance with a 1%, or less, frame error rate (FER) when receiving an input signal at −102 dBm (very low) on the assigned frequency channel in the presence of two continuous wave (CW) tone signals which are each at −43 dBm or greater and are appropriately separated from the assigned channel frequency and from each other such that the third order mixing of the two interfering signals can occur in non-linear operating regions of elements of the receiver to produce an interfering signal in the frequency band of the spread spectrum signal. However, it has been found that the current operating standards and design specifications promulgated in IS-98 regarding IM distortion are inadequate to assure adequate receiver operation under actual conditions.

One possible solution to this problem is to build additional digital system base stations in order to increase the ratio at the mobile station of desired digital signal strength to IM interference signal strength. However, this certainly would be a very costly and inefficient solution to the problem. Other known possible solutions are to attempt to attenuate the signals (both interfering signals and desired signals) at the receiver front end using one or more fixed signal power attenuators switched on and off according to input signal power levels as a substitute for, or in addition to, initial amplification. However, this solution is often found to be inadequate for at least two reasons. First, the fixed attenuator circuits must be switched on at a high enough received signal power level in order to avoid attenuating the received signal power level below a minimum operating level as the entire fixed amount of attenuation is introduced. Also, fixed attenuator circuits often need to incorporate hysteresis to prevent chattering (i.e., rapid fluctuations, or oscillations, around a fixed point) by switching on the attenuator circuits at an even higher received signal power level. Thus, at the lower end of the received signal power level range where IM signals are most problematic, the received signal is often left unprotected (no attenuation of IM producing interfering signals).

There is, therefore, a need in the industry for a system which addresses these and other related, and unrelated, problems.

SUMMARY OF THE INVENTION

Briefly described, the present invention includes a method and an apparatus for variably attenuating received signals in signal processing systems, such as radio cellular telephones and related systems, in order to reduce IM distortion.

According to a first preferred embodiment, the present invention includes a variable attenuator circuit providing variable attenuation in an input section of a receiver section of a cellular telephone. As a trade off by sacrificing a small amount of sensitivity (signal to noise ratio), a greater advantage is gained through achieving a larger amount of IM distortion reduction. The variable attenuator circuit decreases IM distortion by variably attenuating received radio frequency (RF) signals before an initial RF amplification stage (thereby preceding subsequent stages as well) to reduce the level of undesirable non-linear products. The variable attenuator circuit is turned on (activated) to gradually begin attenuating and off (deactivated) at a single input power level (no hysteresis) in response to a received signal strength indicator (RSSI) output by an automatic gain control (AGC) circuit. The variable attenuator circuit begins attenuation for IM distortion reduction at a relatively low input signal power level, and thus is distinct in both purpose and operation from conventional AGC extender circuits. In other words, instead of simply enabling an AGC circuit to handle larger on-channel signals by beginning attenuation at a high input signal power level, one important aspect of the present invention is to begin attenuation at a relatively low input signal power level to reduce IM distortion.

In accordance with this first preferred embodiment of the present invention, variable attenuation is accomplished by use of a circuit including an element with variable impedance. In the particular implementation disclosed herein, the variable impedance element is a PIN diode. The PIN diode is connected to the RF receiver signal line through a small AC-coupling resonating capacitor and acts as variable shunt impedance to ground for the received signals. The PIN diode's impedance level (and thus its level of attenuation) is determined by support circuitry which controls operating current levels in the PIN diode. Thus, by basing the current level through a variable impedance element (such as the PIN diode) on the RSSI, the level of attenuation of the received signal correspondingly varies continuously throughout a range of received signal power levels. In addition, due, at least in part, to the shunt connection of the PIN diode in this first embodiment, attenuation of the RF signals so changes in a non-linear manner that a larger change in attenuation per unit change in input signal strength is provided while the input signal strength is lower. Therefore, the variable attenuator circuit of the present invention is further distinguished from conventional AGC extender circuits which often depend on linear changes in attenuation per unit change in input signal strength. In addition, since the PIN diode of the preferred embodiment of the present invention has a high intercept point, it does not contribute significantly to IM product generation. Furthermore, in accordance with the above-discussed trade off, for every 1 dB of attenuation introduced by the variable attenuator, the desired signal strength is decreased by 1 dB, but the desired signal-to-IM product ratio will increase by 2 dB since the strength of the IM products is reduced by 3 dB.

The disclosed implementation of the first preferred embodiment of the present invention is, as an example, incorporated into a dual-mode FM/CDMA (frequency modulation/code division multiple access) cellular mobile station. It should be understood that the present invention is useful in a variety of other radio communication systems (TDMA, PCS, etc.) since the problems of IM distortion are not isolated to one particular type of radio communication system. Nonetheless, there are many aspects of the present invention discussed throughout the disclosure which are particularly inventive as applied to a dual-mode FM/CDMA cellular mobile station. Now, regarding additional specifics of the disclosed implementation of the first preferred embodiment of the present invention, an attenuator enable signal is supplied from a logic unit of the mobile station to enable operation of the variable attenuator circuit throughout operation in the CDMA mode. In one preferred embodiment, the logic unit includes a central processing unit (CPU). However, this logic unit function can be performed by other devices and combinations of devices (e.g., mobile station modem (MSM) application specific integrated circuitry) which would be obvious to persons skilled in the art and are included within the scope of the present invention. Thus, as soon as the input signal power level rises above a defined activation threshold amount while the variable attenuator circuit is enabled, the variable attenuator circuit is activated and begins attenuating the input signal in the non-linearly changing manner discussed above.

According to a second preferred embodiment of the present invention, an excessive FER condition is used as an additional enabling requirement for the variable attenuator circuit. The attenuator enable signal is not applied to enable the variable attenuator circuit until an excessive FER condition is detected in addition to CDMA mode operation. Thus, according to this second embodiment, attenuation by the variable attenuator circuit begins only after both the variable attenuator circuit is enabled (i.e., CDMA mode and a FER threshold level is reached) and the received signal power level is above the activation threshold (as determined by the RSSI). Thus, according to this second embodiment, even if the received signal power is above the activation threshold, the variable attenuator circuit will not begin attenuating the input signal until an excessive FER condition is encountered when operating in CDMA mode.

It is, therefore, an object of the present invention to provide a method and an apparatus for variably attenuating received RF signals in order to reduce IM distortion.

Another object of the present invention is to provide a method and an apparatus for variably attenuating received RF signals at a relatively low (e.g., between −100 dBm and −80 dBm in cellular telephones) received signal power level.

Yet another object of the present invention is to provide a method and an apparatus for variably attenuating received RF signals in a non-linearly changing manner that provides a larger change in attenuation per unit change in input signal power level at lower, rather than higher, received RF signal power levels.

Still another object of the present invention is to provide an IM distortion reducing variable attenuator circuit in a dual-mode mobile station which is continuously enabled, requiring no switching between an enabled and disabled state, throughout operation of the mobile station in one communication mode.

Still another object of the present invention is to provide an IM distortion reducing variable attenuator circuit in a mobile station which is enabled only after an excessive frame error rate is detected throughout operation of the mobile station in one communication mode.

Still another object of the present invention is to provide an IM distortion reducing variable attenuator circuit which includes a variable impedance path to ground.

Still another object of the present invention is to provide an IM distortion reducing variable attenuator circuit which includes a variable impedance path to ground for an RF input signal line preceding RF amplification.

Still another object of the present invention is to provide an IM distortion reducing variable attenuator circuit with attenuation which varies with received signal strengths.

Still another object of the present invention is to provide an IM distortion reducing variable attenuator circuit which includes a path to ground for an RF input signal line which includes an element with variable impedance being controlled responsive to a received signal strength.

Still another object of the present invention is to provide an IM distortion reducing variable attenuator circuit which is turned on (activated) to gradually begin attenuating and off (deactivated) at a single input power level, thereby avoiding chatter and any need for hysteresis.

Still another object of the present invention is to provide an RF signal input attenuation circuit which reduces IM distortion to achieve an FER of less than or equal to 1.0% with 95% confidence with both a total RF signal power level of −90 dBm and test interference signal power levels of at least −35 dBm.

Still another object of the present invention is to provide a method and an apparatus that so provides varying attenuation that an FER of a received RF signal is reduced to less than or equal to 1% with 95% confidence when the RF signal power level is −90 dBm and the two interference signals have power levels of at least −35 dBm, and when the RF signal power level is −79 dBm and the two interference signals have power levels of at least −26 dBm.

Still another object of the present invention is to provide a method and an apparatus for beginning RF input signal attenuation when the RF input signal achieves a threshold power level wherein the threshold power level is between −100 dBm and −80 dBm.

Still another object of the present invention is to provide a method and an apparatus for beginning RF input signal attenuation when the RF input signal achieves a threshold power level, wherein the threshold power level is −95 dBm.

Still another object of the present invention is to provide a method and an apparatus for using the same RF input signal power level for both beginning RF input signal attenuation when RF input signal strength is rising, and ending RF input signal attenuation when RF input signal strength is falling.

Other objects, features, and advantages of the present invention will become apparent upon reading and understanding this specification, when taken in conjunction with the accompanying drawings.

DETAILED DESCRIPTION OF THE PREFERRED EMBODIMENTS

Figure 1:
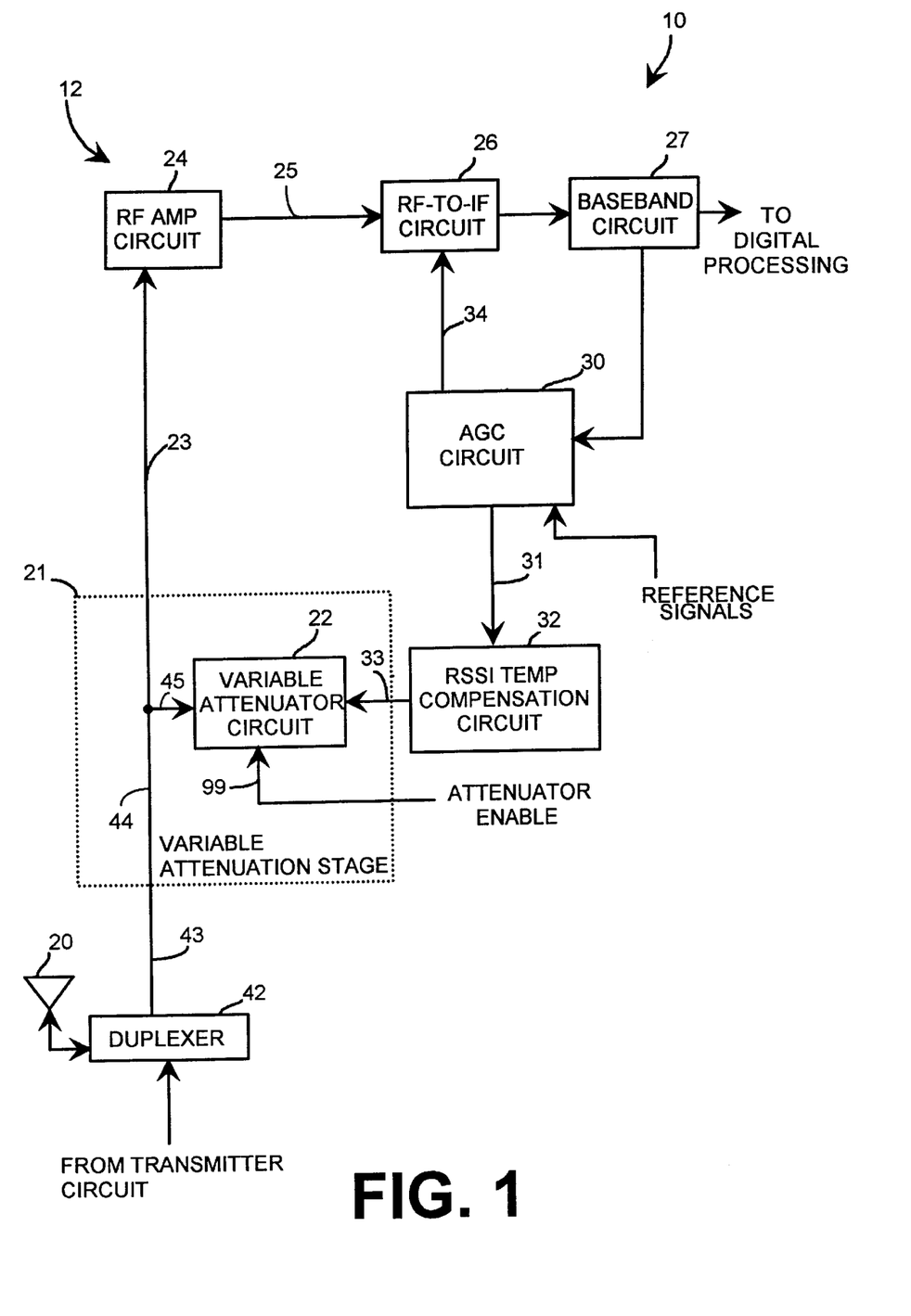
FIG. 1 is a block diagram representation of a portion of a cellular telephone including a variable attenuator circuit in accordance with the preferred embodiments of the present invention.

Referring now to the drawings in which like numerals represent like components throughout the several views, FIG. 1 is a block diagram representation of a portion of a cellular telephone (mobile station) 10 including a variable attenuator circuit 22 in accordance with one implementation of the preferred embodiments of the present invention. The example implementation referenced in the figures and discussed below includes an FM/CDMA dual-mode cellular telephone, thus both frequency modulated (FM) signals and code division multiple access (CDMA) digitally encoded signals are received and processed by the mobile station 10, while many CDMA-only signals paths are represented. It is also understood that there are other acceptable implementations of the present invention, including time division multiple access (TDMA) systems, personal communication systems (PCS), and any other radio systems susceptible to IM distortion.

An antenna 20 is connected to a duplexer 42, both of which are connected as part of a cellular receiver section 12, much of which is shown in FIG. 1. In accordance with the preferred embodiments of the present invention, RF signals from the duplexer 42 are output to a variable attenuation stage 21 including the variable attenuator circuit 22 (discussed in greater detail below) through an RF signal input line 43. After the variable attenuation stage 21, signals are input through an amplifier input line 23 to an RF amplifier (RF AMP) circuit 24. Amplified RF signals are output on line 25 from the RF amplifier circuit 24 to an RF-to-IF (intermediate frequency) circuit 26 where the RF signals are, in a conventional manner, converted to intermediate frequencies, AGC amplified, filtered, etc., before being output to a conventional baseband circuit 27 to be demodulated and converted to digital signals for further processing (not shown), as would be understood by those reasonably skilled in the art of the present invention. An AGC circuit 30 is connected to the baseband circuit 27 to conventionally monitor the strength of the received signal and generate both a receiver amplification control signal which is output on a receiver amplification control line 34 and a received signal strength indication (RSSI) which is output along an RSSI line 31. By monitoring the strength of the output from the RF-to-IF circuit 26, the AGC circuit 30 detects the strength of the RF signals received by the mobile station 10. The AGC loop is completed back through the RF-to-IF circuit 26 through the receiver amplification control line 34 to control and continually stabilize the output level of the RF-to-IF circuit 26. As discussed below, an RSSI temperature compensation circuit 32 adjusts the RSSI for temperature variations and outputs a temperature compensated RSSI on RSSI temp line 33. For clarification, it should be understood that FM signals are processed along separate paths (not shown) such that received FM signals are split away at a point inside the RF-to-IF circuit 26. In still other embodiments of the present invention, the exact location of the variable attenuator circuit 22 varies, including locations after the initial RF amplifier circuit 24. In addition, other embodiments including a number of variable attenuation stages to reduce IM distortion are also contemplated, including stages located before and after the initial RF amplifier circuit 24.

Through the RSSI temp line 33, the temperature adjusted RSSI signal is supplied to the variable attenuator circuit 22. When enabled by an attenuator enable signal on an attenuator enable line 99 and when activated as discussed below, the variable attenuator circuit 22 variably attenuates the received RF signal on an attenuation stage input line 44 from the RF signal input line 43 before the RF signal output from the duplexer 42 reaches the RF amplifier circuit 24 through amplifier input line 23. The amount of attenuation varies according to the temperature adjusted RSSI signal on the RSSI temp line 33 such that the amount of attenuation increases with increases in the input RF signal power level. In addition, in a non-linear fashion, the amount of attenuation increase for a given increase in received RF signal power level is greater at lower received RF signal power levels. Along the attenuator enable line 99, the attenuator enable signal is received from a logic unit (not shown), such as a central processing unit (CPU) for the mobile station 10. The attenuator enable line 99 is enabled, according to this disclosed implementation of the first preferred embodiment of the present invention, as long as the mobile station 10 is operating in the CDMA mode. Thus, this attenuator enable signal on the attenuator enable line 99 is, according to this first preferred embodiment, independent of the power level of the received RF signal, as well as other factors, such as the FER. In addition, as is discussed in greater detail below, the variable attenuator circuit 22 is configured to be activated and begin attenuating the RF signal from the RF signal input line 43 when the RF signal reaches an activation power level. Likewise as the RF signal power level falls below the same activation power level, the variable attenuator circuit 22 is deactivated and attenuation substantially ceases.

Figure 2:
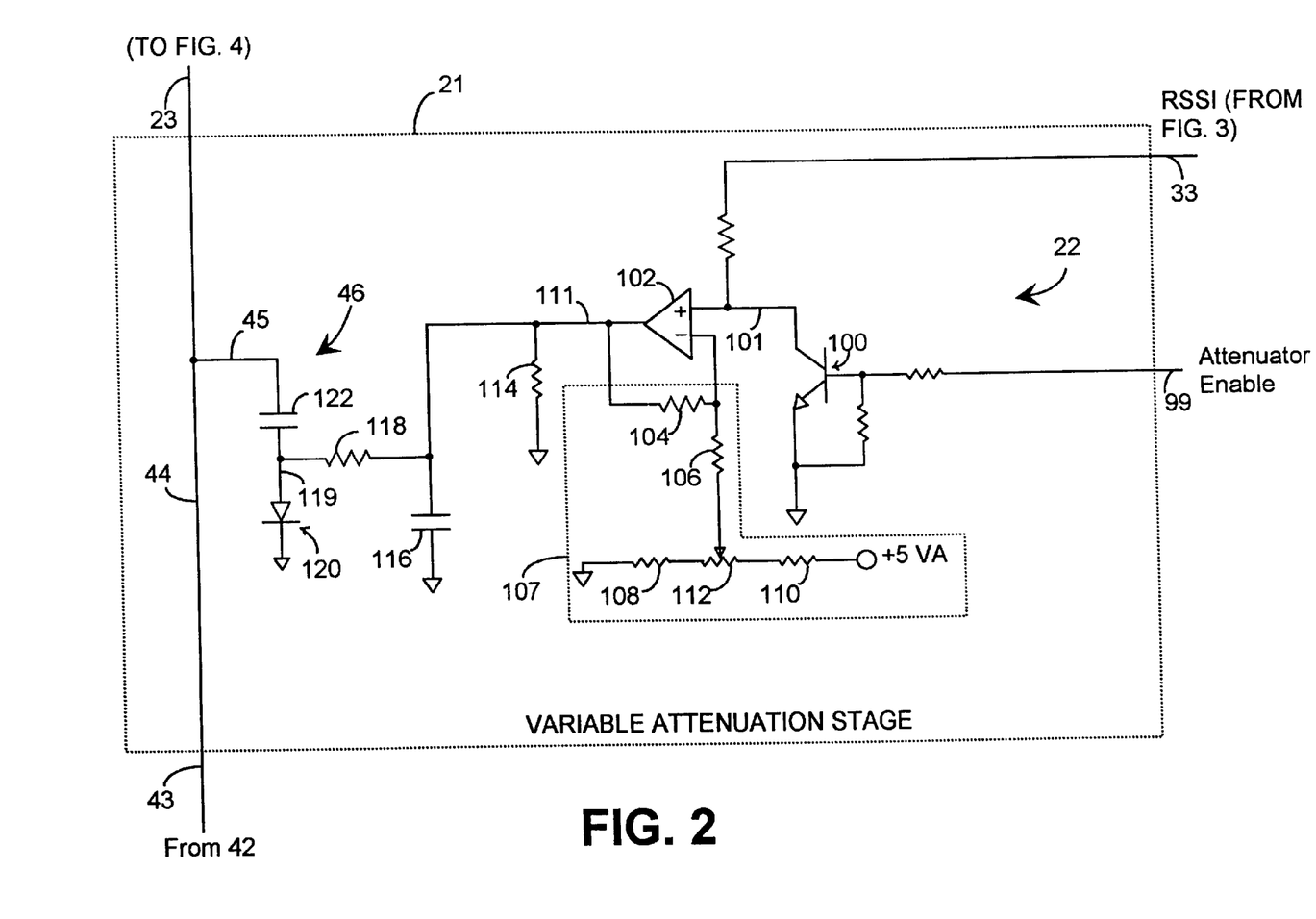
FIG. 2 is a schematic representation of the variable attenuation stage of FIG. 1.
Figure 3:
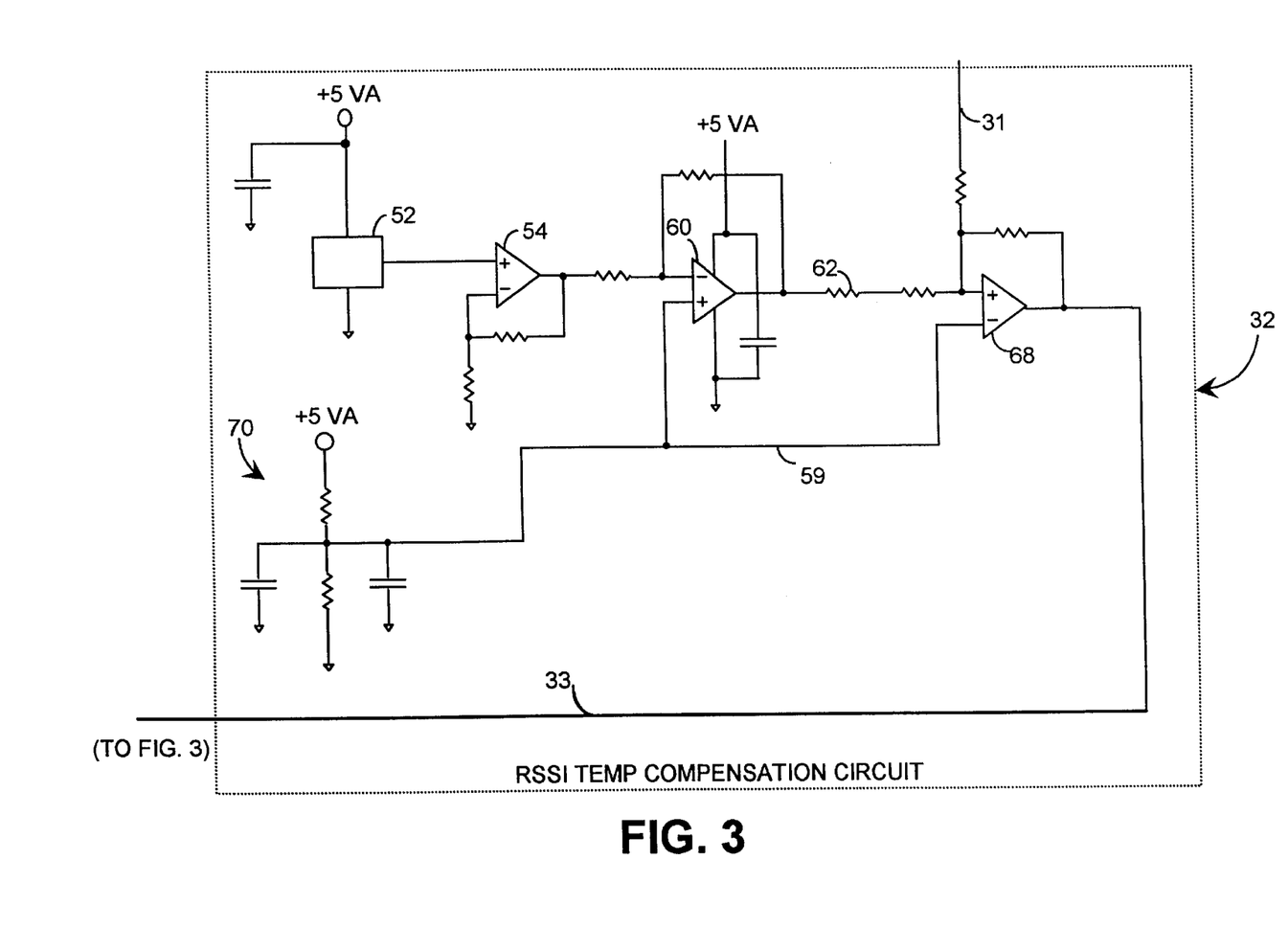
FIG. 3 is a schematic representation of the RSSI temperature compensation circuit of FIG. 1.
Figure 4:
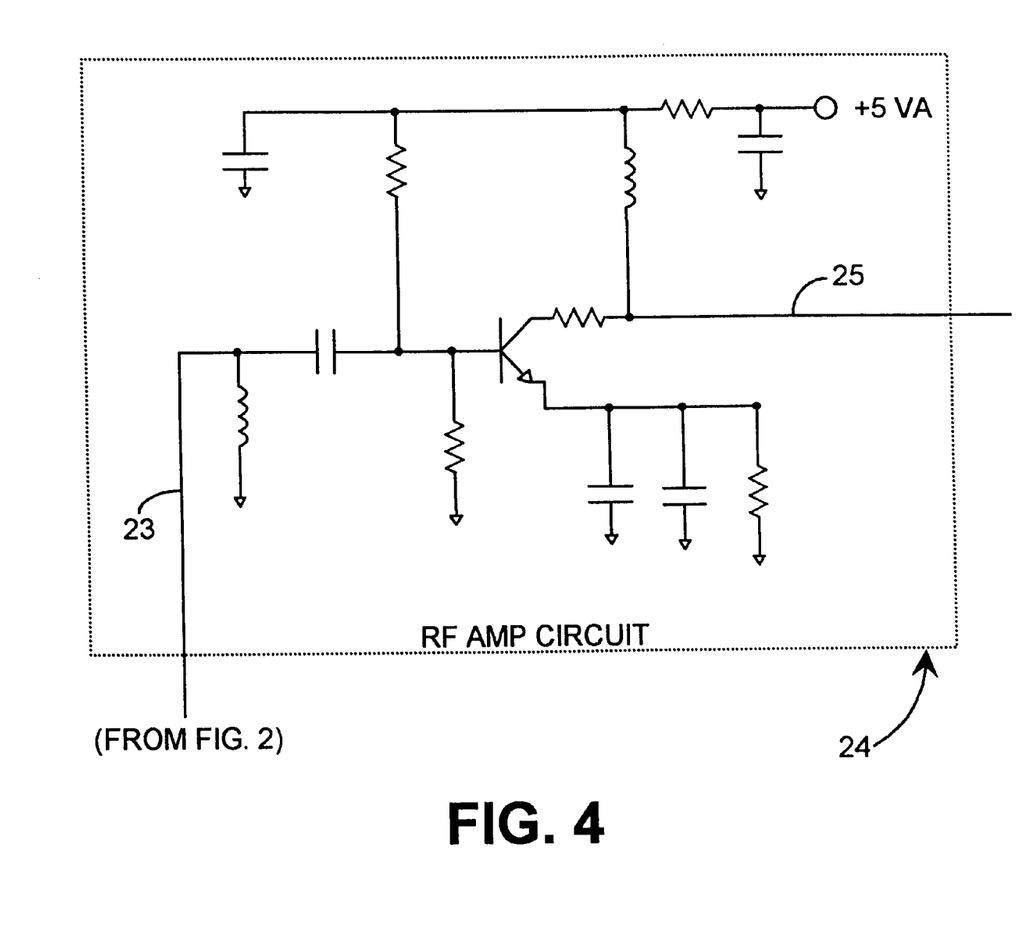
FIG. 4 is a schematic representation of the RF amplifier circuit of FIG. 1.

FIGS. 2, 3, and 4 are schematic representations of the variable attenuation stage 21, the RSSI temperature compensation circuit 32, and the RF amplifier circuit 24, respectively, of FIG. 1. Again, with reference to FIG. 2, according to the preferred embodiments of the present invention, RF signals from the RF signal input line 43 are attenuated by the variable attenuator circuit 22 according to the temperature compensated RSSI signal on the RSSI temp line 33 after the variable attenuator circuit 22 is enabled through the attenuator enable signal on the attenuator enable line 99 and activated as described above. The attenuator enable line 99 is connected to a switching arrangement including a transistor switch 100 to effectively ground the RSSI temp line 33 through line 101 and disable the variable attenuator circuit 22 when the attenuator enable line 99 is not enabled, i.e., during communication in FM mode. In the disclosed implementation of the preferred embodiment of the present invention, when the attenuator enable line 99 is enabled, the temperature compensated RSSI on the RSSI temp line 33 is supplied to an operational amplifier (threshold op amp 102) where it is compared to an activation threshold level determined by a threshold/gain circuit 107, including resistors 104, 106, 108, 110, and variable resistor 112 arranged as shown in FIG. 2. Other circuitry arrangements that function similar to threshold/gain circuit 107 would provide acceptable substitutes for threshold/gain circuit 107 as would be understood by persons skilled in the art. The threshold/gain circuit 107 controls the voltage supplied to the negative input of the threshold op amp 102, and thus to the rest of the variable attenuator circuit 22. As a result, the voltage supplied to the negative input of the threshold op amp 102 via the threshold/gain circuit 107 determines the activation threshold level at which the variable attenuator circuit 22 is activated and begins to attenuate the RF signals on the amplifier input line 23, as discussed in more detail below. In addition to resistors 106 and 104 which are primarily responsible for setting the gain of the op amp 102, the threshold/gain circuit 107 includes a voltage divider to set the activation threshold level which, according to one implementation of the preferred embodiment, includes resistors 108, 110, and variable resistor 112 connected between a voltage source and ground as shown. In another implementation of this preferred embodiment, only fixed resistors 110 and 108 are connected between the voltage source and ground.

The temperature compensated RSSI signal feeds from RSSI temp line 33 into the positive input of threshold op amp 102. While the temperature compensated RSSI signal level is above an activation threshold determined by the threshold/gain circuit 107, the output signal on line 111 from the threshold op amp 102 fluctuates according to the temperature compensated RSSI signal as an amplified comparison between the temperature compensated RSSI signal and the activation threshold. The signal on line 111 flows through a supply resistor 118 which is connected to an attenuating branch 46. A resistor 114 is connected as shown to line 111 to drain off residual current in line 111 when the variable attenuator circuit 22 is not attenuating, and a filtering capacitor 116 is connected as shown to line 111 to ground unwanted AC signals. The attenuating branch 46 includes an attenuation line 45 connected in a shunt arrangement (as shown) to the attenuation stage input line 44, as well as a PIN diode 120 and an AC coupling capacitor 122. The PIN diode 120 functions as a variable impedance for current flowing from the attenuation stage input line 44, and the amount of impedance is determined by the current supplied through resistor 118. The AC-coupling capacitor 122 is connected between the PIN diode 120 and the attenuation stage input line 44 to provide DC isolation between the PIN diode 120 and the RF amplifier circuit 24, and the value of the AC-coupling capacitor 122 is selected to resonate with any stray inductance in the circuit to maximize available attenuation by the PIN diode 120. Thus, according to the current supplied to the PIN diode 120 through the resistor 118, the PIN diode 120 and the capacitor 122 provide the RF signal input line 43 a variable impedance path to ground through the attenuation stage input line 44 and the attenuating line 45. As depicted in FIG. 2, the PIN diode 120 is connected to the attenuation stage input line 44 in a shunt arrangement which contributes to the non-linear changes in attenuation per unit change in received RF signal strength, as discussed below. However, because of the high intercept point of the PIN diode 120, it does not contribute significantly to the to IM product generation. Furthermore, for every 1 dB of attenuation by the PIN diode 120, the desired signal-to-IM product ratio will increase by 2 dB.

While the attenuator enable signal is enabled (e.g., while in CDMA mode for the first preferred embodiment), as long as the temperature compensated RSSI on the RSSI temp line 33 effectively indicates an RF signal input power level on the RF signal input line 43 which is above the activation threshold level (activation power level), the variable attenuator circuit 22 is activated and utilizes the attenuation branch 46 with the PIN diode 120 to variably attenuate RF signals on the RF signal input line 43 to produce attenuated RF signals on the amplifier input line 23 in accordance with the temperature compensated RSSI signal levels. In accordance with the first preferred embodiment, the variable attenuator circuit 22 must be enabled as described above in order to be activated. When the temperature compensated RSSI indicates a received RF signal power level below the activation threshold level amount, the variable attenuator circuit 22 is deactivated and there is very little attenuation of RF signals in the RF signal input line 43. In one implementation, this activation power level (as determined in large part by the inventive arrangement of the present invention and the values of the resistors 108, 110, 112 in the threshold/gain circuit 107) is approximately −95 dBm. However, depending on implementation and communication environment specifics, this activation power level may vary between −100 dBm and −85 dBm. Generally, the activation power level will vary according to the requirements specific to the RF receiver system being used with the present invention as would be understood by persons reasonably skilled in the art. In addition, because the AGC circuit 30 (FIG. 1) is capable of accurately processing signals from the RF-to-IF circuit 26 resulting from originally received RF signals having strengths ranging from between (possesses an effective range of) approximately −110 dBm to −25 dBm, the activation power level is in the lower portion of the AGC range. Thus, the variable attenuator circuit 22 is certainly not functioning as a conventional AGC extender which would be activated in the higher portion of the AGC range.

Referring now to FIG. 3, as stated above, the RSSI temperature compensation circuit 32 adjusts the RSSI on the RSSI line 31 for temperature variations to help maintain consistent operation of the mobile station 10. A temperature dependent voltage (temp signal) generated by a temperature sensor integrated circuit (IC) 52 is fed into the positive input of operational amplifier (op amp) 54 which adds an appropriate amount of gain thereto. In accordance with the preferred embodiment of the present invention, one example of an acceptable temperature signal supply 52 is a thermistor plus operational amplifier package manufactured by National Semiconductor Corp., of Santa Clara, Calif. The temp signal is next added to a reference signal (Vref) on a Vref line 59 by an op amp adder 60 to produce a referenced signal at the output of op amp adder 60. Vref is provided by a voltage divider circuit 70 and is the bias voltage at the positive input of op amp adder 60. The gain adjusted temp signal from op amp 54 is provided to the negative input of op amp adder 60. The referenced signal is next combined with the RSSI signal from RSSI line 31 and together fed into the positive input of an op amp 68. The combined referenced signal plus RSSI signal is added to Vref in op amp 68. Vref is also the biasing voltage at the negative input of op amp 68. Thus, the output of op amp 68 is a temperature compensated RSSI signal. In other embodiments of the present invention where temperature compensation is not desired or necessary, the RSSI temperature compensation circuit 32 is omitted. With brief reference to FIG. 4, which shows a schematic view of the RF amplifier circuit 24 of FIG. 1 in accordance with the first preferred embodiment of the present invention, the amplifier input line 23 provides attenuated RF signals which are amplified and output along line 25 by the RF amplifier circuit 24, which would be understood by one reasonably skilled in the art.

Figure 5:
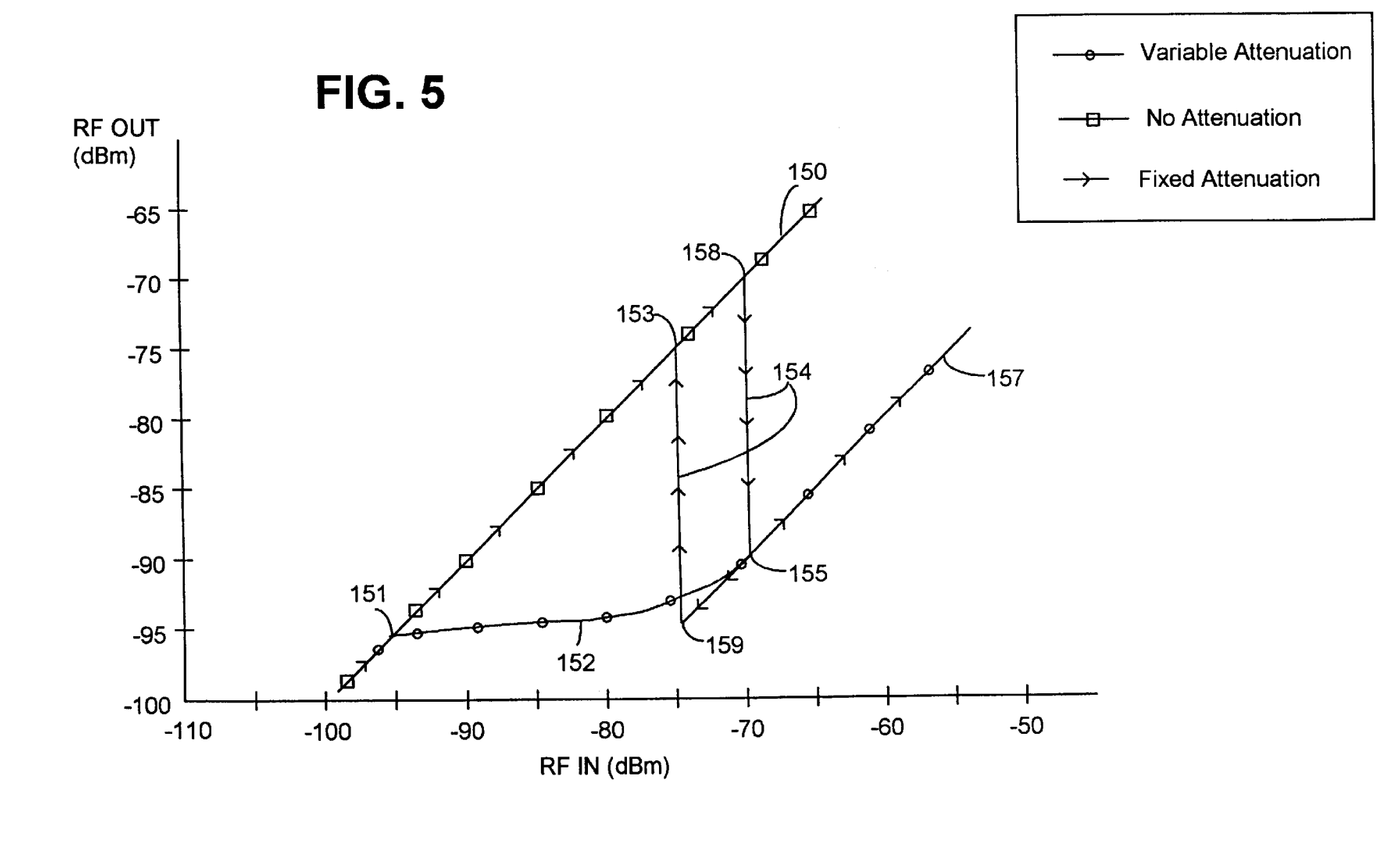
FIG. 5 is a graphical representation of an RF input versus an RF output showing no attenuation, fixed attenuation, and variable attenuation in accordance with the variable attenuator circuit of FIG. 1.

FIG. 5 is a graphical representation of an RF input versus an RF output showing no attenuation, fixed attenuation, and variable attenuation in accordance with the variable attenuator circuit 22 of the present invention. A variable attenuation path 152, denoted by circles, illustrates the attenuation characteristics provided by the variable attenuator circuit 22. For comparison, a no attenuation path 150 is denoted by squares to illustrate RF input versus RF output without attenuation, i.e., with the variable attenuation stage 21 omitted. For further comparison, a fixed attenuation path 154 is denoted by arrow heads to illustrate RF input versus RF output with fixed attenuation, i.e., with a fixed attenuation stage substituted for the variable attenuation stage 21. At point 151, the variable attenuator circuit 22 is activated, as described above, and begins attenuating the received RF signals in a non-linearly changing manner as shown and described above. The point 151 is determined by the threshold level circuit 107 (FIG. 2). As illustrated by the graph, the received RF signals are variably attenuated in a continuously changing and non-linear manner (without creating any additional significant IM distortion products) along the variable attenuation path 152 between points 151 and 155, corresponding to a range of RF input signal strength for which there is continuous change in variable attenuation (range of variable change in attenuation). The point 151 is also the deactivation point below which the variable attenuator circuit 22 is deactivated and provides virtually no attenuation, thus the variable attenuation path 152 overlays the no attenuation path 150 for RF inputs below −95 dBm.

The fixed attenuation path 154 also overlays a portion of the no attenuation path 150. However, for rising RF inputs, a fixed amount of attenuation is switched on at point 158, and a constant maximum level of attenuation is provided as shown on the graph along the linear maximum attenuation portion 157 of path 154 beginning at point 155, which is also the point where the variable attenuation path 152 begins overlaying the fixed attenuation path 154 to represent the variable attenuator circuit 22 reaching maximum attenuation. For falling RF inputs, the RF output continues to fall past point 155 to point 159 before the fixed attenuator is switched out, then rising to point 153. As pointed out above, the switch on point 158 for fixed attenuation must be high enough to prevent the received RF signal (RF IN) from dropping below a minimum power level. Furthermore, to avoid a chattering effect, fixed attenuation must be switched out (159, 153) at a lower received RF signal power level than when switched in (158, 155), thus producing the hysteresis effect shown in FIG. 5. These characteristics of fixed attenuation illustrate why the lower received RF power levels are not attenuated, thus the receiver circuits are much more vulnerable to IM distortion effects in fixed attenuation systems.

Figure 6:
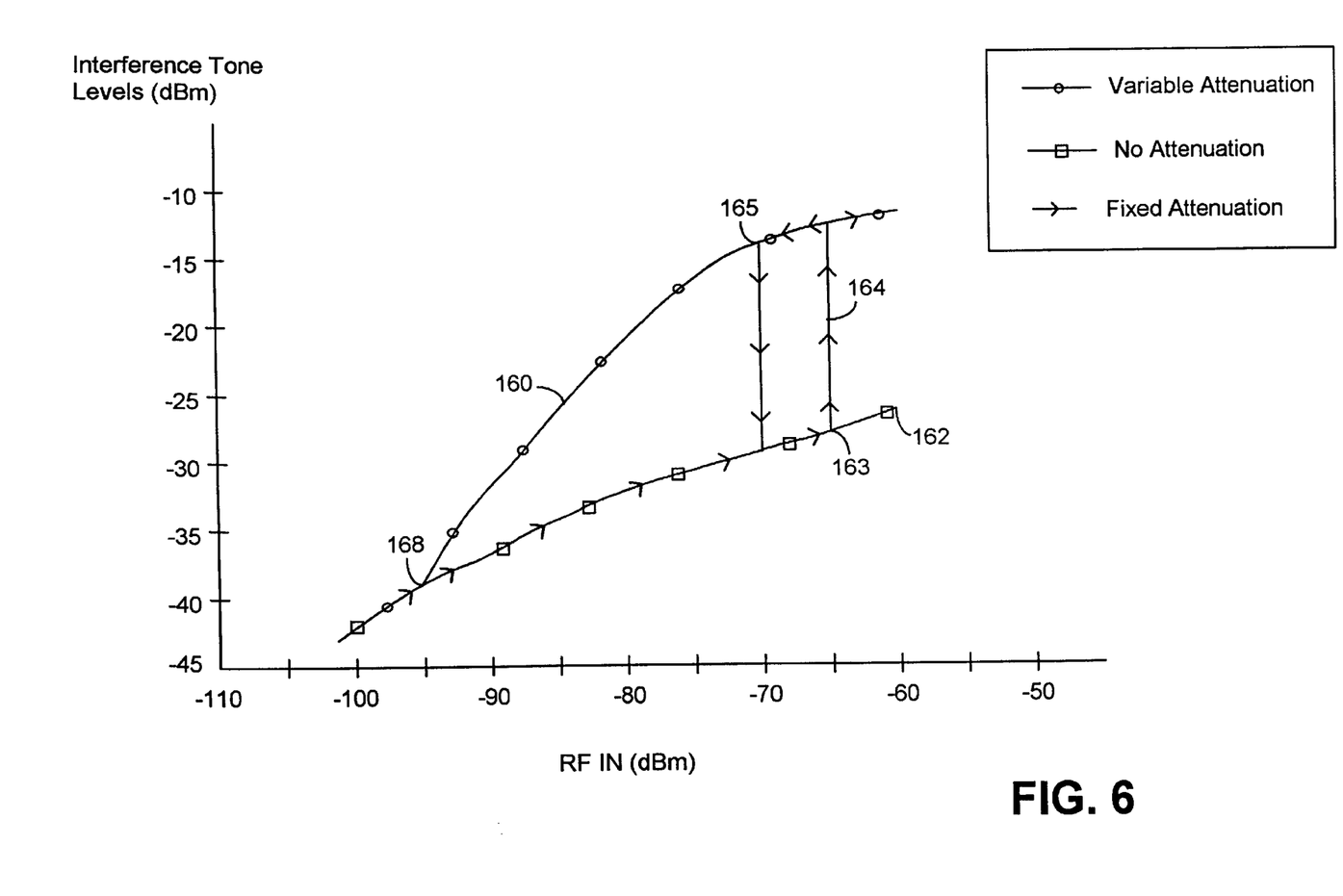
FIG. 6 is a graphical representation illustrating RF receiver performance in terms of a minimum frame error rate criteria as a function of interference RF input versus desired RF input showing signals with no attenuation, fixed attenuation, and variable attenuation in accordance with the variable attenuator circuit of FIG. 1.

FIG. 6 is a graphical representation illustrating RF receiver performance in terms of a minimum FER criteria as a function of interference RF input versus desired RF input showing no attenuation, fixed attenuation, and variable attenuation in accordance with the variable attenuator circuit 22 of FIG. 1. More specifically, the graph represents RF receiver performance of a 1% or less frame error rate with 95% confidence as a function of RF test two tone signal power (Interference Tone Levels) versus a desired RF input signal power (RF IN) which is the basis of the recommended minimum performance standards for Dual-Mode Wideband Spread Spectrum Cellular Mobile Stations as specified in TIA/EIA/IS-98, section 9.4.3. In other words, the paths of FIG. 6 show how much interference can be tolerated at any given desired RF input power level to maintain a FER of 1% (or less) with 95% confidence. A variable attenuation path 160, denoted by circles, illustrates the receiver performance characteristics in terms of the above criteria when employing variable attenuation by the variable attenuator circuit 22. For comparison, a no attenuation path 162 and a fixed attenuation path 164, denoted by squares and arrow heads, respectively, are shown to illustrate receiver performance without attenuation and with fixed attenuation, respectively. At point 168, the variable attenuator circuit 22 is activated, as described above, and begins attenuating the received RF signals. However, with fixed attenuation, path 164, a fixed amount of attenuation is switched on at point 163 but must be switched off at point 165, a lower desired input signal level, to avoid the chatter effect, as discussed above. As illustrated by the variable attenuation path 160, in comparison to a receiver with no IM attenuation, the variable attenuator circuit 22, when activated, maintains the RF receiver FER performance over higher interference RF signal levels for any given received signal level above −95 dBm. As compared to a receiver with fixed attenuation, the variable attenuator circuit 22 maintains the RF receiver FER performance over higher interference RF signal levels for received signal strengths approximately between −95 dBm and −65 dBm (RF IN rising), and between −95 dBm and −70 dBm (RF IN falling).

Figure 7:
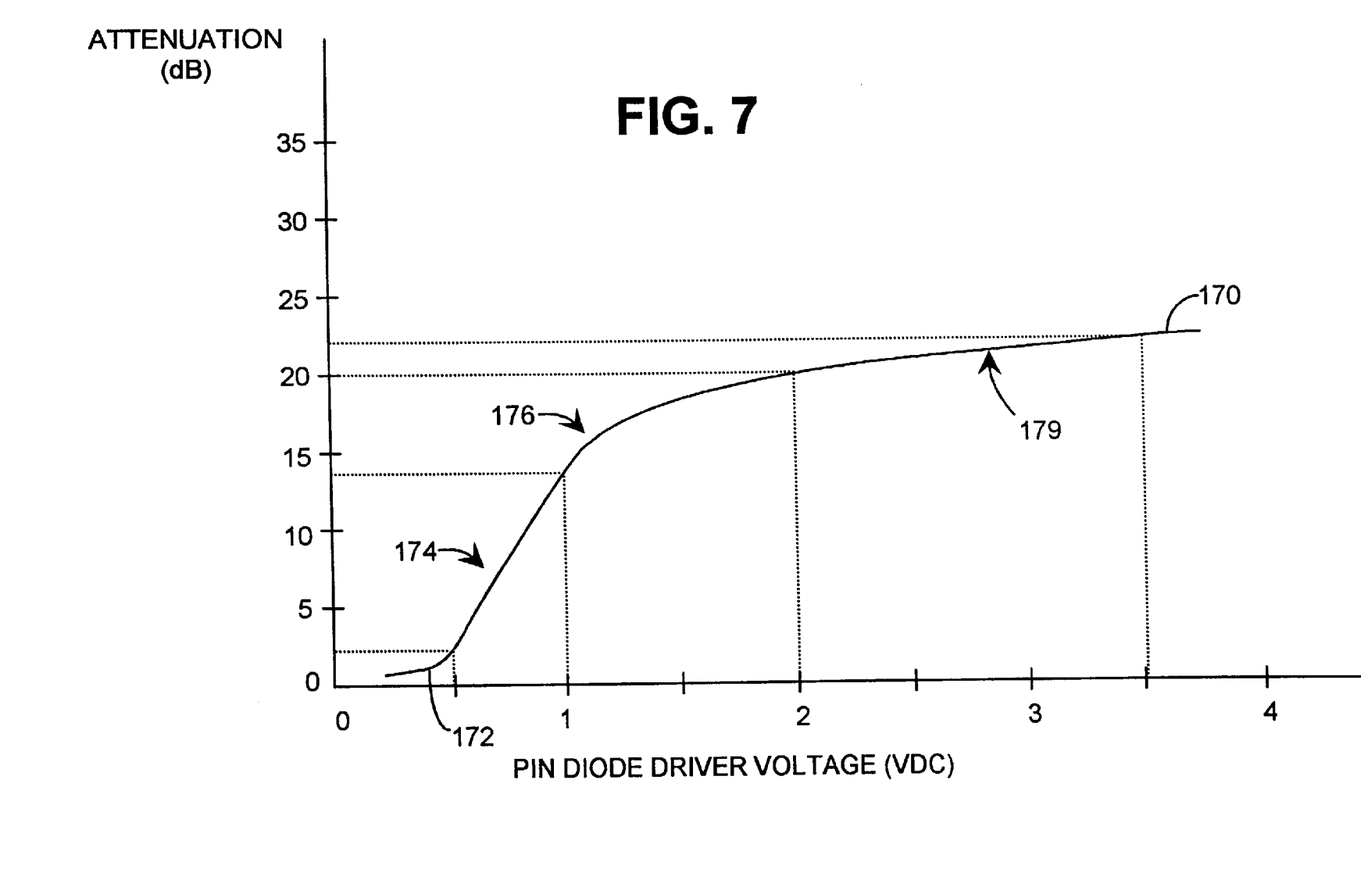
FIG. 7 is a graphical representation of attenuation versus a PIN diode driver voltage in accordance with the variable attenuator circuit of FIG. 1.

FIG. 7 is a graphical representation of attenuation versus attenuator driver voltage in accordance with the variable attenuator circuit 22 of FIG. 1. Path 170 graphically illustrates the non-linearly changing relationship between attenuation of the RE input signal (ATTENUATION) and the driver voltage of the PIN diode 120 (PIN DIODE DRIVER VOLTAGE) as measured across resistor 114 (FIG. 2) which is related to the amount of current flowing through the PIN diode 120. The graph is also representative of the relationship between attenuation levels and received RF signal strength throughout the above discussed range of variable attenuation since the PIN diode driver voltage is representative of the RSSI signal as described above. Advantageous attenuation characteristics (e.g., varying, continuous, non-linearly changing) of the variable attenuator circuit 22 are depicted by path sections 174, 176 and 179. In path section 174, which depicts the attenuation characteristics just after activation of the variable attenuator circuit 22, point 172, there is an approximately 12.0 dB change in attenuation for an approximately 0.5 volt change in driver voltage. In path section 176 there is an approximately 6.0 dB change in attenuation for an approximately 1.0 volt change in driver voltage. In path section 178 there is an approximately 2.0 dB change in attenuation for an approximately 1.5 volt change in driver voltage. Thereafter, the PIN diode 120 is saturated at a constant peak attenuation level. Thus, the reader will appreciate the non-linearity feature of the variable attenuator circuit 22 of the present invention whereby maximum change in attenuation at lower RF signal levels where IM distortion is most deleterious is provided. Furthermore, even though rapid attenuation increases are seen in path section 174, the gradual beginning of attenuation (as opposed to a stepped introduction of fixed attenuation) eliminates the need for built in hysteresis. Furthermore, the non-linearity in change in attenuation per unit change in driver voltage further distinguishes the present invention from fixed attenuator circuits as well as conventional AGC extender circuits.

According to a second preferred embodiment of the present invention, the attenuator enable signal supplied to the variable attenuator circuit 22 (FIG. 1) through the attenuator enable line 99 is only applied when the FER exceeds an FER threshold amount while the mobile station operating in CDMA mode. Thus, according to this second embodiment, the variable attenuator circuit 22 is activated and begins attenuation only after both the received RF signal power level is above the activation threshold power level (as determined by the temperature compensated RSSI) and the variable attenuator circuit 22 is enabled as just described (i.e., the received RF signal contains enough errors to cause the FER to exceed the FER threshold level while the mobile station is operating in CDMA mode). In accordance with another embodiment of the present invention, a PIN diode (not shown) is connected in series (instead of shunt) with the attenuation stage input line 44 to variably attenuate the received RF signals. In addition, other attenuation circuits with variable impedance methods are also contemplated, including those which vary resistance and those which vary reactance.

While the embodiments of the present invention which have been disclosed herein are the preferred forms, other embodiments of the method and apparatus of the present invention will suggest themselves to persons skilled in the art in view of this disclosure. Therefore, it will be understood that variations and modifications can be effected within the spirit and scope of the invention and that the scope of the present invention should only be limited by the claims below. In addition, the corresponding structures, materials, acts, and equivalents of all means or step plus function elements in the claims below are intended to include any structure, material, or acts for performing the functions in combination with other claimed elements as specifically claimed. It is also understood that any relative dimensions and relationships shown on the drawings are given as the preferred relative dimensions and relationships, but the scope of the invention is not to be limited thereby.

I claim:

1. An intermodulation (IM) distortion reduction circuit for a radio frequency (RF) receiver having an RF input signal receiver line, said IM distortion reduction circuit comprising:

a variable attenuator connected to attenuate and reduce IM distortion for RF signals on the RF input signal receiver line of the RF receiver; and an attenuation controller coupled to said variable attenuator to control attenuation by said variable attenuator responsive to RF input signal power levels, wherein said attenuation controller includes an operational amplifier, wherein said operational amplifier includes an attenuator control input coupled to a received RF signal strength indication source, a threshold level input, and an amplified comparison output coupled to an input of said variable attenuator, and wherein said attenuator controller further includes an attenuator enabler coupled to said attenuator control input, wherein said attenuator enabler includes a switch with a control input, a ground input, and an enabling output coupled to said attenuator control input.

2. The IM distortion reduction circuit of claim 1, wherein said variable attenuator includes a variable impedance path to ground for the RF input receiver line, and wherein the impedance of said variable impedance path to ground varies in response to the RF input signal power levels.

3. The IN distortion reduction circuit of claim 1, wherein said variable attenuator includes a variable impedance element which varies continuously in impedance throughout a range of RF input signal power levels.

4. The IM distortion reduction circuit of claim 3, wherein said variable impedance element is a PIN diode coupled between the RF input receiver line and a ground potential.

5. The IM distortion reduction circuit of claim 4, wherein said variable attenuator further includes an AC-coupling resonating capacitor interposed between said PIN diode and the RF input signal receiver line.

6. The IM distortion reduction circuit of claim 3, wherein said variable impedance element varies in impedance according to a control voltage generated by said attenuator controller, and wherein said impedance varies in a non-linearly changing manner throughout the range of RF input signal power levels.

7. The IM distortion reduction circuit of claim 6, wherein said variable attenuator so attenuates received RF signals in a non-linearly changing manner that the received RF signals experience a larger change in attenuation per unit change of the received RF signal strength while the received RF signal strength is in a lower portion of the range of RF input signal power levels.

8. The IM distortion reduction circuit of claim 1, wherein said variable attenuator includes a variable impedance element which varies continuously in impedance throughout a range of RF input signal power levels, wherein said variable impedance element is a PIN diode coupled between the RF input receiver line and a ground potential, and wherein said variable attenuator so attenuates received RF signals in a non-linearly changing manner that the received RF signals experience a larger change in attenuation per unit change of the received RF signal strength while the received RF signal strength is in a lower portion of the range of RF input signal power levels.

9. An RF input circuit for a radio frequency (RF) receiver, said RF input circuit comprising:

an RF antenna;

a duplexer including an antenna input and an RF signal receiver output, wherein said antenna input is coupled to said RF antenna;

an RF amplifier including an RF signal input and an RF signal output, wherein said RF signal input is coupled to said RF signal receiver output of said duplexer;

a variable attenuator including an attenuator input coupled to both said RF signal receiver output of said duplexer and said RF signal input of said RF amplifier; and an attenuation controller coupled to said variable attenuator to control attenuation by said variable attenuator responsive to RF input signal power levels, wherein said attenuator controller further includes an attenuator enabler coupled to said attenuation controllers, and wherein said attenuator enabler includes a switch with a control input, a ground input, and an enabling output coupled to said attenuator control input.

10. The RF input circuit of claim 9, wherein said attenuation controller activates said variable attenuator to begin attenuating received RF signals when the received RF signal strengths rise above an RF signal power level threshold, and wherein said RF signal power level threshold is below −80 dBm.

11. The RF input circuit of claim 9, wherein said variable attenuator further includes a variable impedance path to ground for said RF input receiver line, and wherein the impedance of said variable impedance path to ground varies in response to the RF input signal power levels.

12. The RF input circuit of claim 9, wherein said variable attenuator further includes a variable impedance element which varies continuously in impedance throughout a range of RF input signal power levels.

13. The RF input circuit of claim 9, wherein said variable impedance element is a PIN diode coupled between said RF signal receiver output of said duplexer and a ground potential.

14. The RF input circuit of claim 13, wherein said variable attenuator further includes an AC-coupling resonating capacitor interposed between said PIN diode and said RF signal receiver output of said duplexer.

15. The RF input circuit of claim 12, wherein said variable impedance element varies in impedance according to a control voltage generated by said attenuator controller, and wherein said impedance varies in a non-linearly changing manner throughout the range of RF input signal power levels.

16. The RF input circuit of claim 9, further comprising a plurality of non-linear elements creating third order products, and wherein said variable attenuator is located to receive RF signals before said non-linear elements.

17. The RF input circuit of claim 9, wherein said attenuator controller so controls said variable attenuator in a non-hysteresis manner that said variable attenuator attenuates received RF signals when the RF signals have a power level of at least an RF signal power level threshold, and that said variable attenuator provides substantially no attenuation when the RF signals have a power level below said RF signal power level threshold.

18. The RF input circuit of claim 9, wherein said attenuation controller includes an operational amplifier, wherein said operational amplifier includes an attenuator control input, a threshold level input, and an amplified comparison output coupled to said attenuator input.

19. The RF input circuit of claim 9, further comprising a received RF signal strength indication (RSSI) source connected to said attenuation controller.

20. The RF input circuit of claim 19, wherein said RSSI source includes an automatic gain control (AGC) circuit.

21. The RF input circuit of claim 20, wherein said attenuation controller activates said variable attenuator to begin attenuating received RF signals when the received RF signal strengths are in a low portion of an effective operating range of said AGC circuit.

22. The RF input circuit of claim 21, wherein said attenuation controller activates said variable attenuator to begin attenuating the received RF signals when the received RF signal strengths rise above an RF signal power level threshold, and wherein said RF signal power level threshold is below −80 dBm.

23. The RF input circuit of claim 20, wherein said AGC circuit possesses an effective operating range for received RF signal strengths of, approximately, −110 dBm to −25 dBm.

* * * * *